(12) United States Patent
Lauterbach et al.

(10) Patent No.: US 7,005,360 B2
(45) Date of Patent: Feb. 28, 2006

(54) METHOD FOR FABRICATING A MICROELECTRONIC CIRCUIT INCLUDING APPLYING METAL OVER AND THICKENING THE INTEGRATED COIL TO INCREASE CONDUCTIVITY

(75) Inventors: Christl Lauterbach, Höhenkirchen-Siegertsbrunn (DE); Christian Paulus, Weilheim (DE)

(73) Assignee: Infineon Technologies AG, (DE)

( * ) Notice: Subject to any disclaimer, the term of this patent is extended or adjusted under 35 U.S.C. 154(b) by 81 days.

(21) Appl. No.: 10/381,406

(22) PCT Filed: Oct. 4, 2001

(86) PCT No.: PCT/DE01/03792

§ 371 (c)(1),
(2), (4) Date: Jun. 27, 2003

(87) PCT Pub. No.: WO02/29863

PCT Pub. Date: Apr. 11, 2002

(65) Prior Publication Data

US 2004/0092079 A1 May 13, 2004

(30) Foreign Application Priority Data

Oct. 4, 2000 (DE) ................. 100 48 960

(51) Int. Cl.
*H01L 21/20* (2006.01)
*H01L 21/4763* (2006.01)

(52) U.S. Cl. ............... 438/381; 438/627; 438/637; 438/643

(58) Field of Classification Search ........... 438/381, 438/627, 637, 643; 336/199, 223, 229
See application file for complete search history.

(56) References Cited

U.S. PATENT DOCUMENTS

| 4,613,843 | A | | 9/1986 | Esper et al. ............. 336/232 |
|---|---|---|---|---|
| 5,446,311 | A | | 8/1995 | Ewen et al. ............. 257/531 |
| 5,652,173 | A | | 7/1997 | Kim ...................... 438/381 |
| 5,763,108 | A | * | 6/1998 | Chang et al. .......... 428/694 R |
| 5,793,272 | A | | 8/1998 | Burghartz et al. ......... 336/600 |
| 6,395,637 | B1 | * | 5/2002 | Park et al. .............. 438/706 |
| 6,490,128 | B1 | * | 12/2002 | Sato .................... 360/126 |

FOREIGN PATENT DOCUMENTS

| DE | 197 21 310 A1 | 11/1997 |
|---|---|---|
| DE | 197 37 294 A1 | 4/1998 |
| EP | 0 551 735 B1 | 7/1999 |
| WO | WO 95/05678 | 2/1995 |

* cited by examiner

Primary Examiner—William M. Brewster
(74) Attorney, Agent, or Firm—Altera Law Group, LLC; Jeffrey R. Stone

(57) ABSTRACT

A method for fabricating a microelectronic circuit having an improved electrically conductive element. The method includes providing a finished processed microelectronic circuit having a monolithically integrated coil and having a passivation layer situated above at least the monolithically integrated coil. The method further comprises removing at least part of the passivation layer above the monolithically integrated coil and applying a metal layer above the monolithically integrated coil so that the metal layer is electrically coupled to the monolithically integrated coil.

15 Claims, 6 Drawing Sheets

METHOD FOR FABRICATING A MICROELECTRONIC CIRCUIT INCLUDING APPLYING METAL OVER AND THICKENING THE INTEGRATED COIL TO INCREASE CONDUCTIVITY

This application is a 371 of PCT/DE01/03792 Oct. 4, 2001.

BACKGROUND OF THE INVENTION

1. Field of the Invention

A microelectronic circuit is disclosed in [1]. This microelectronic circuit is an integrated semiconductor element having an electrically conductive element (an inductor coil).

2. Description of the Related Prior Art

One problem with such electrically conductive elements known from the prior art is that their inherent conductivity is relatively low. This requires special operating conditions, such as e.g. low temperatures, or, under defined operating conditions, e.g. at defined temperatures, leads to a poor quality factor of the electrically conductive element. This in turn leads to a poor quality factor of the integrated semiconductor element having the conductive element.

Furthermore, [2] describes a coil applied on a ceramic substrate.

[3] describes a method for repairing a semiconductor memory. In a semiconductor chip having fuses and a redundancy memory cell which can replace a normal memory cell, in the case where a normal memory cell is defective, the fuses are cut out in order thereby to connect the redundancy memory cell instead of the defective normal memory cell.

[4] describes a method for fabricating an inductive element or a capacitor element on a semiconductor chip, there being arranged, in a dielectric arranged between two metal layers of predetermined form parallel to the chip plane, at least one metal plug of the length of the metal layers, which metal plug effects through-plating connection of the metal layers.

[5] describes a method for fabricating a monolithically integrated coil in a microelectronic circuit, in which the coil is formed during the production process of the microelectronic circuit. A patterned dielectric layer is applied on a first electrically conductive layer applied on a substrate and a second, patterned, electrically conductive layer is applied on said dielectric layer. The first and second electrically conductive layers are electrically contact-connected to one another through the dielectric layer.

BRIEF SUMMARY OF THE INVENTION

Consequently, the invention is based on the problem of improving the quality factor of a monolithically integrated coil in a microelectronic circuit.

According to the invention, this problem is solved by the provision of a method for fabricating a microelectronic circuit having an improved electrically conductive element.

According to the invention, a microelectronic circuit having an improved monolithically integrated coil as electrically conductive element is fabricated by a method
in which provision is made of a finished processed microelectronic circuit having a monolithically integrated coil and having a passivation layer situated above at least the monolithically integrated coil;
in which at least a part of the passivation layer above the monolithically integrated coil is removed; and
in which a metal layer is applied above the monolithically integrated coil in such a way that the metal layer is electrically coupled to the monolithically integrated coil.

The monolithically integrated coil is fabricated from electrically conductive material.

The problem on which the invention is based is also solved by the provision of a microelectronic circuit having at least one monolithically integrated coil, fabricated according to this method, as electrically conductive element.

The method according to the invention thickens an already existing electrically conductive, monolithically integrated coil in a finished processed microelectronic circuit with a metal which has the same conductivity as, or a higher conductivity than, the metal of the monolithically integrated coil. By virtue of this thickening of the monolithically integrated coil, more conductive material is applied on interconnects of the monolithically integrated coil by comparison with the unthickened state, and this leads to a reduced impedance by comparison with the unthickened state. The reduction of the impedance is accompanied by a corresponding increase in the conductivity of the affected monolithically integrated coil of the microelectronic circuit.

Consequently, the invention advantageously achieves an improved quality factor of the electrically conductive element of a microelectronic circuit.

A further advantage of the method according to the invention is that the method follows the fabrication of an already finished processed microelectronic circuit.

The expression "finished processed" is to be understood to mean that state of the microelectronic circuit which the microelectronic circuit has upon entering the next higher stage of the fabrication market. In the context of the invention, the product is to be regarded as finished processed for example if a manufacturer of computer components only has to incorporate this microelectronic circuit into a computer component without changing the nature of the microelectronic circuit in any way, and the microelectronic circuit, and therefore also the computer component itself, is capable of performing the planned function.

In the context of the invention, then, a finished processed microelectronic circuit is a circuit whose state after conventional fabrication is completed and concluded in such a way that it could normally functionally fulfil the purpose envisaged for this circuit, without having to be subjected to further method steps in the fabrication process.

A further advantage of the method according to the invention is that the thickness of the applied metal layer can be adapted as desired to specific requirements in the context of the same method step. This means that the method according to the invention achieves a high degree of flexibility with regard to the configuration of the applied metal layer, without additional method steps being necessary.

According to one embodiment of the method according to the invention, before the application of the metal layer, an electrically conductive auxiliary layer may additionally be applied at least above the monolithically integrated coil of the microelectronic circuit, so that the metal layer is subsequently applied on the auxiliary layer.

Depending on the thickness, configuration and nature of the electrically conductive auxiliary layer, the latter can be used for different purposes.

By way of example, in the case of poor adhesion between the metal layer and the monolithically integrated coil and/or poor adhesion between the metal layer and further regions of the passivation layer of the microelectronic circuit which have not been removed, the electrically conductive auxiliary layer may be used to improve the said adhesion. It is thus ensured that the metal layer adheres fixedly on the surface at least of the monolithically integrated coil of the microelectronic circuit.

However, the auxiliary layer may also inherently have a diffusion blocking function, thereby ensuring that metal atoms of the metal layer applied thereon do not diffuse into the unremoved regions of the passivation layer and thereby contaminate the latter. This barrier function of the auxiliary layer is of great importance for example in the case when copper is used as metal for the metal layer. This is because copper atoms tend to diffuse, over a relatively long time, into silicon dioxide, which is a material that is often used for passivation layers. By utilizing the diffusion blocking function of the auxiliary layer, such diffusion of the copper atoms into the passivation layer can essentially be prevented.

The auxiliary layer may be applied
  to the electrically conductive elements of the microelectronic circuit, or
  to the electrically conductive elements of the microelectronic circuit and to possibly unremoved regions of the passivation layer.

As an example of the flexibility of the method according to the invention, regions of the metal layer and/or of the auxiliary layer can be removed independently of one another or together by means of a wet or dry etching method. By way of example, after the removal of the at least one part of the passivation layer above the monolithically integrated coil, a metal layer may be applied over the whole area on the microelectronic circuit, and this metal layer can then be etched away in places by means of a wet or dry etching method in such a way as to produce the desired patterning at least above the underlying monolithically integrated coil. No auxiliary layer is used in this case.

For the case where an auxiliary layer is used, after the removal of the at least one part of the passivation layer above the monolithically integrated coil, the said auxiliary layer can be applied over the whole area on the surface of the microelectronic circuit. Proceeding from this state of production, there are then, in particular, two possibilities in the context of further processing.

As a first possibility, the metal layer may be applied over the whole area on the auxiliary layer, and the metal layer and the underlying auxiliary layer may be removed together, i.e. in a single method step, by means of a wet or dry etching method in such a way as to produce the desired patterning of the now thickened, monolithically integrated coil.

As a second possibility, after the application of the auxiliary layer, the latter may be etched away in places to form a desired patterning, and the metal layer may then be applied on the already patterned auxiliary layer. Afterwards, the metal layer is removed in places by means of a second etching method in such a way as to produce the desired structure of the metal layer. By way of example, the metal layer may be etched away in such a way that it lies only above those points of the electrically conductive element which are already covered with a section of the auxiliary layer.

However, it is also perfectly possible that, by virtue of such staggering of the etching methods, i.e. by virtue of successive implementation of the removal of the auxiliary layer and of the metal layer, all possible layer combinations with regard to the nature and the relative positions of the layers with respect to one another are possible for the metal layer crucial for conductivity.

Thus, the effect that can be achieved by such successive implementation of the etching methods for the auxiliary layer and the metal layer is that an individual microelectronic circuit is formed, so that the metal layer for example:
  lies directly on the monolithically integrated coil of the microelectronic circuit;
  lies on at least one region of the auxiliary layer which intrinsically lies directly above a monolithically integrated coil of the microelectronic circuit;
  lies directly on the unremoved regions of the passivation layer; or
  lies on at least one region of the auxiliary layer which intrinsically lies directly on the unremoved regions of the passivation layer.

The above possibilities show the flexibility of the invention's method for fabricating a microelectronic circuit having at least one monolithically integrated coil in which the quality factor of the said circuit is improved by reducing the inherent impedance of the monolithically integrated coil.

It should be noted that the removal—carried out at the beginning of the method—of regions of the passivation layer can also be effected by means of a wet or dry etching method. Moreover, specific regions of the passivation layer, the metal layer and/or the auxiliary layer can be removed in a targeted manner as explained above with the aid of known photolithographic methods.

The metal layer and the auxiliary layer can be applied by means of an electrodeposition method, an electroless deposition method, a vapour deposition method, a sputtering method, an electrodeposition method or a plasma CVD method (CVD=Chemical Vapor Deposition).

According to the invention, the metal layer is formed with a thickness of 0.5 $\mu$m to 10 $\mu$m, preferably with a thickness of 3 $\mu$m to 6 $\mu$m. The metal layer may be formed from a metal which corresponds to the metal of the electrically conductive element, or which is different from the metal of the electrically conductive element. According to the invention, when forming the metal layer, use is made of a metal of high conductivity, e.g. a metal whose conductivity exceeds that of the material of the monolithically integrated coil. Examples of such metals which can be used in the method according to the invention are copper, gold, silver, platinum, aluminium or a plurality thereof.

The expression "a plurality thereof" is to be understood to mean either the separate use of a plurality of metals, so that different regions of the microelectronic circuit are coated with different metals in each case, or the use of a plurality of metals as a homogeneous alloy which coats the microelectronic circuit over the whole area.

It should be noted that any desired metal having a high conductivity can be used in the method according to the invention.

The auxiliary layer, if present, is preferably formed with a thickness of 0.5 $\mu$m to 20 $\mu$m, more preferably with a thickness of 5 $\mu$m to 10 $\mu$m. To form the auxiliary layer it is possible to use conductive materials, for example tungsten silicide, titanium, platinum, nickel, chromium, nickel-chromium alloy, molybdenum, palladium or rhodium.

The invention also comprises a microelectronic circuit having at least one monolithically integrated coil which is fabricated by the method according to the invention.

Exemplary embodiments of the invention are illustrated in the figures and are explained in more detail below.

In figures:

FIGS. 1a to 1d show, in a diagrammatic sectional view of a finished processed, monolithically integrated coil, the sequence of an exemplary embodiment of the method according to the invention in which a metal layer is applied directly on the interconnects of the coil;

FIGS. 2a to 2d show, in a diagrammatic sectional view of a finished processed, monolithically integrated coil, the sequence of an exemplary embodiment of the method according to the invention in which an auxiliary layer and a metal layer are applied on the interconnects of the coil, the auxiliary layer and the metal layer being etched away in the same method step;

FIGS. 3a to 3d show, in a diagrammatic sectional view of a finished processed, monolithically integrated coil, the sequence of an exemplary embodiment of the method according to the invention in which an auxiliary layer and a metal layer are applied on the interconnects of the coil, the auxiliary layer and the metal layer being etched away in mutually separate method steps; and FIGS. 4a to 4c show further possible exemplary embodiments of the method according to the invention in which the metal layer not only lies above the interconnects of the coil but also lies with and without an intervening auxiliary layer on unremoved regions of the passivation layer.

In a further step (not shown), the surface of the passivation layer 101 and also the interconnects 102 of the coil, which interconnects are now thickened by the metal layer 104, are coated with a further passivation layer for protection against external effects.

Figure 1A:
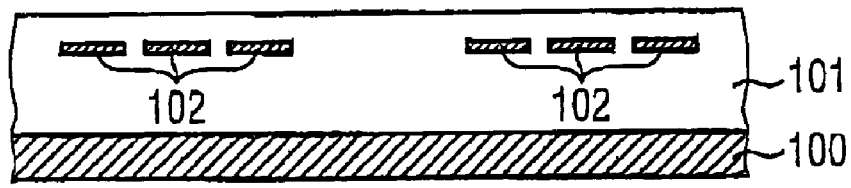
FIG. 1a shows a diagrammatic cross-sectional view of a microelectronic circuit having a substrate 100, a passivation layer 101 and interconnects 102 of a coil that is to be regarded as an electrically conductive element. In the case of the finished processed microelectronic circuit shown in FIG. 1a, the interconnects 102 are each covered by a part of the passivation layer 101.
Figure 1B:
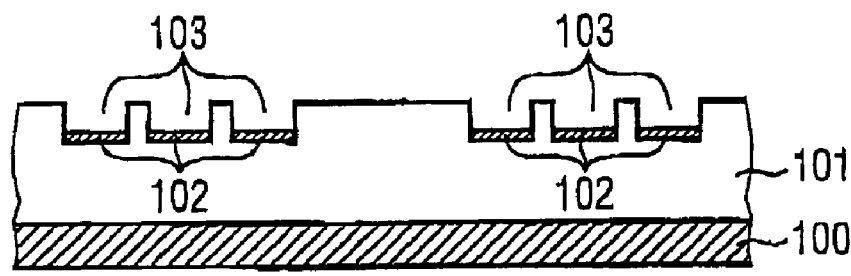
FIG. 1b shows a diagrammatic cross-sectional view of the microelectronic circuit from FIG. 1a, in which the regions of the passivation layer 101 above the interconnects 102 have been removed, with the result that removed regions 103 are formed above the respective interconnects of the monolithically integrated coil.
Figure 2A:
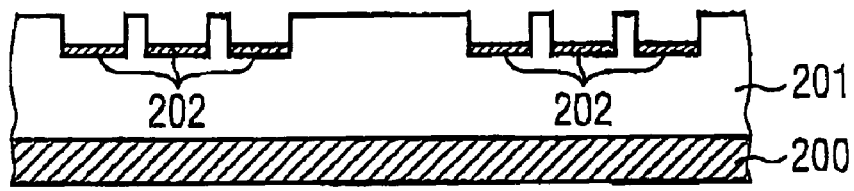

FIG. 2a shows the microelectronic circuit in the production state of FIG. 1b, in which the regions of the passivation layer 201 above the respective interconnects 202 of the coil have been removed.

Figure 2B:
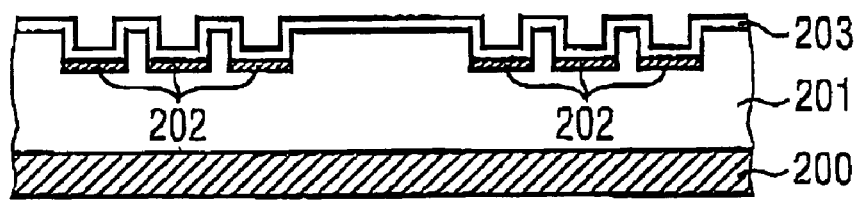

FIG. 2b shows the result of the application of an auxiliary layer 203 on the entire surface of the microelectronic circuit. In this case, all areas of the unremoved passivation layer 201 and also of the interconnects 202 of the coil are coated with the auxiliary layer 203. Furthermore, areas of the passivation layer 201 to the sides of the interconnects 202 of the coil, which areas have been uncovered by the removal of those regions of the passivation layer 201 which are situated above the interconnects 202, are also covered with the auxiliary layer.

DETAILED DESCRIPTION OF THE INVENTION

Figure 2C:
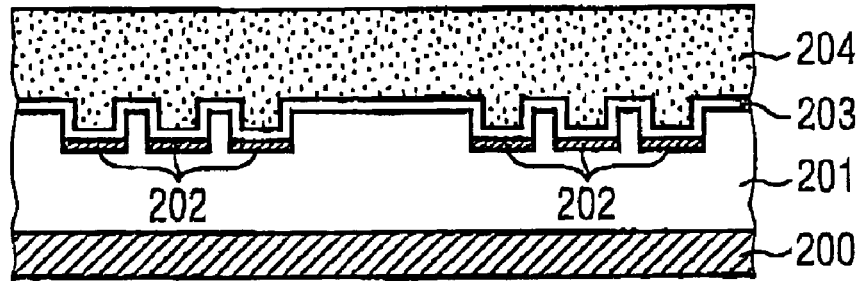

It should be noted that the illustration represented in FIG. 2c is a sectional view, i.e. the interconnects 202 extend both out from the area of the paper and in from the rear area of the paper, with the result that the regions uncovered by the removal of the passivation layer 201 are elongate, trench-shaped cutouts in the surface of the passivation layer 201. For this reason, the auxiliary layer 203 clinging tightly to these cutouts also assumes this elongate, trench-shaped configuration.

FIG. 2c shows the result of the application of a metal layer 204 on the auxiliary layer 203.

Figure 2D:
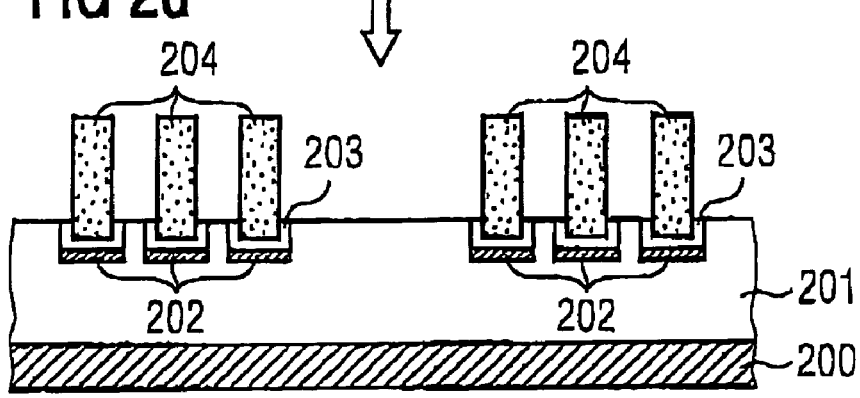

FIG. 2d shows the result of the removal of the metal layer 204 and of the auxiliary layer 203 in such a way that only those regions of the passivation layer 201 of the auxiliary layer 203 and of the metal layer 204 which are situated above the interconnects 202 of the coil remain after the removal process. Consequently, according to this exemplary embodiment, the metal layer 204 is separated from the respective interconnects 202 of the coil by the auxiliary layer 203. Since the auxiliary layer 203 has an electrical conductivity, as explained above, the electrical contact connection between the respective interconnects 202 and the metal layer 204 is ensured.

In the case of the exemplary embodiment illustrated in FIG. 2, it should be noted that the removal of the metal layer 204 and of the auxiliary layer 203 can be effected in a single step, e.g. by wet or dry etching.

In a further step (not shown), the surface of the passivation layer 201 and also the interconnects 202 of the coil, which interconnects are now thickened by the metal layer 204, can be coated with a further passivation layer for protection against external effects.

Figure 3A:
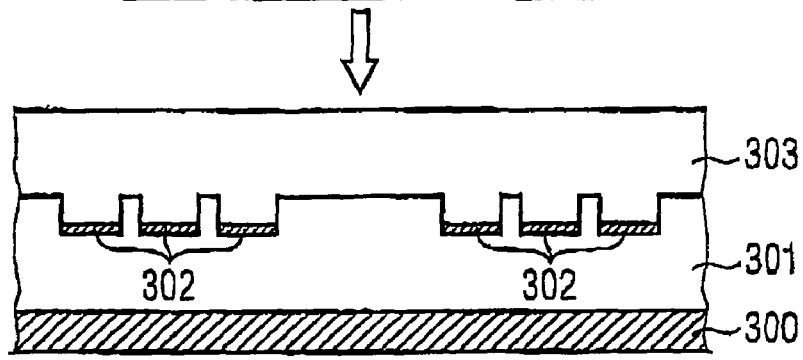

Proceeding from FIG. 1b, FIG. 3a shows the result of the application of an auxiliary layer 303 over the whole area on the microelectronic circuit. In this case, the uncovered interconnects 202 of the coil and also those regions of the interconnects 202 of the coil which were uncovered by the initially effected removal of the parts of the passivation layer 301, and also those regions of the passivation layer 301 which were not removed are coated with the auxiliary layer 303.

Figure 3B:
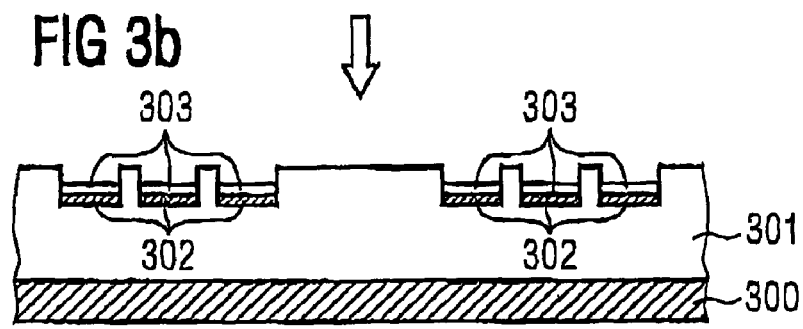
Figure 3C:
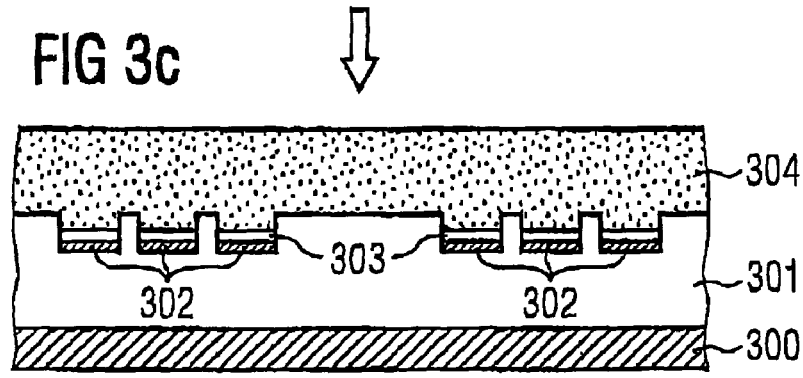

FIG. 3b shows the production state of the microelectronic circuit after the removal of the auxiliary layer 303 in such a way that only those regions of the auxiliary layer 303 which lie directly above the respective interconnects 302 of the coil remain. The auxiliary layer is etched away for example by means of a wet or dry etching method.

Afterwards, a metal layer 304 is applied over the whole area on the microelectronic circuit. The metal layer 304 makes contact with only the topmost areas of the passivation layer 301 and also those regions of the auxiliary layer 303 which lie directly above the respective interconnects 302 of the coil.

Figure 3D:
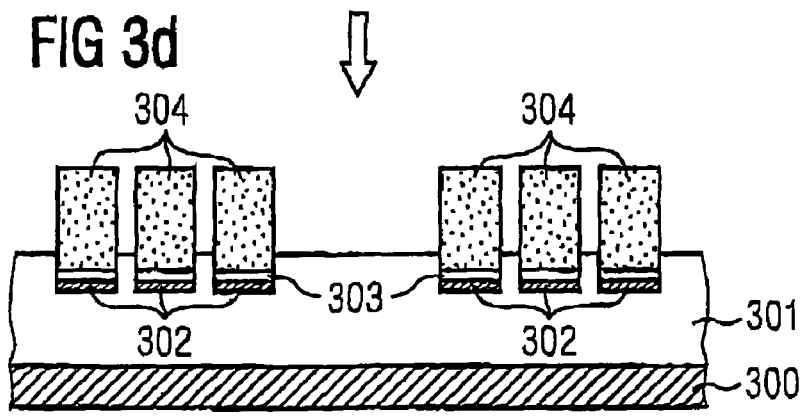

FIG. 3d shows the result of the removal of regions of the metal layer 304 in such a way that the metal layer 304 only remains above those regions where there is already a section of the auxiliary layer 303.

It should be noted that, in the exemplary embodiment of the method which is illustrated in FIG. 3, the removal of the auxiliary layer 303 and of the metal layer 304 is effected in two mutually separate method steps.

In a further step (not shown), the uncovered surface of the passivation layer 301 and also the interconnects 302 of the coil, which interconnects are now thickened by the metal layer 304, can be coated with a further passivation layer for protection against external effects.

Figure 1C:
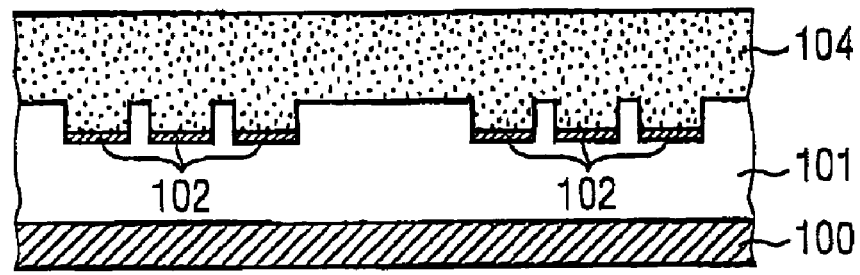
FIG. 1c shows the result of a whole-area application of a metal layer 104 on the surface of the microelectronic circuit. The metal of the metal layer 104 expediently has an intrinsic conductivity which is higher than the conductivity of the metal of the interconnects 102. This metal layer 104 makes contact both with the interconnects 102 of the coil directly and with the unremoved regions of the passivation layer 101. Furthermore, the metal layer 104 makes contact with the sidewalls of the removed regions 103 shown in FIG. 1b, which sidewalls are produced by the removal of those regions of the passivation layer 101 which are situated above the interconnects 102 of the coil.
Figure 4A:
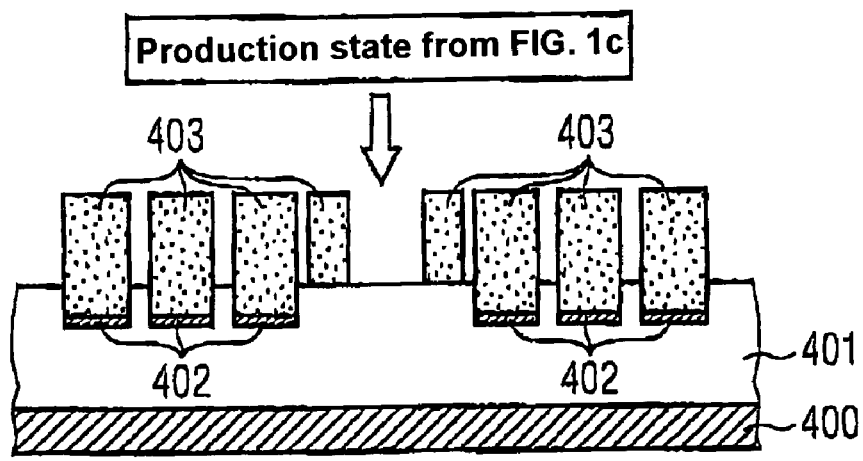

The exemplary embodiment shown in FIG. 4a firstly proceeds from the production state from FIG. 1c, in which a metal layer 104 was applied without an auxiliary layer over the whole area on the surface of the microelectronic circuit. Proceeding from FIG. 1c, the metal layer 104 is then removed in such a way that regions remain both directly above the respective interconnects of the coil 402 and directly above the unremoved regions of the passivation layer 401. Consequently, e.g. any remaining regions of the area of the passivation layer 401 can be utilized for developing the already existing coil.

In a further step (not shown), the removed regions of the passivation layer 401 and also the interconnects 402 of the coil, which interconnects are now thickened by the metal layer 403, can be coated with a further passivation layer for protection against external effects.

Figure 4B:
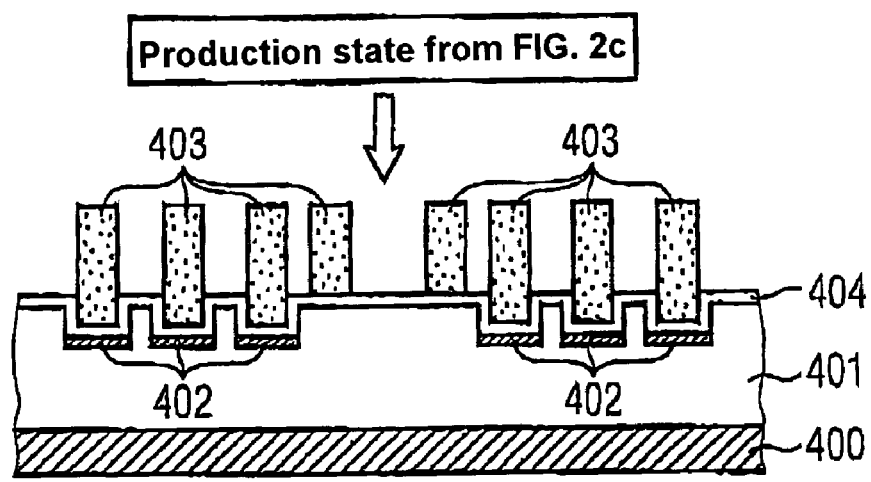

FIG. 4b proceeds from the production state from FIG. 2c, in which both an auxiliary layer 203 and a metal layer 204 were applied successively on the surface of the microelectronic circuit. FIG. 4b shows the result of the removal both of those regions of the metal layer 403 (corresponds to the metal layer 104 in FIG. 2c) which lie directly above the respective interconnects 402 of the coil, and of other regions of the metal layer 403 which lie on the auxiliary layer above the unremoved region of the passivation layer 401.

Figure 4C:
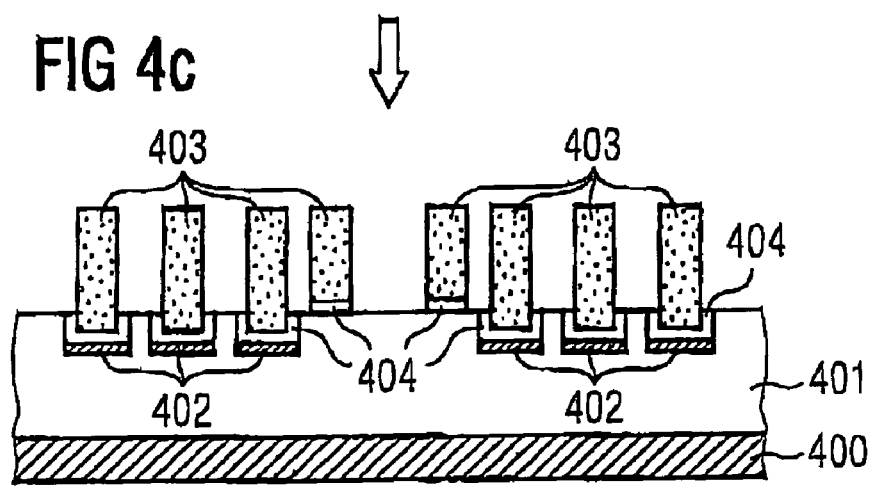

FIG. 4c shows the end result after the removal of those regions of the auxiliary layer 404 on which there is no metal layer 403.

It should be noted that the removal of the metal layer 403 and the removal of the auxiliary layer 404 can be effected in two mutually separate method steps or as a single method step.

In a further step (not shown), the removed regions of the passivation layer 401 and also the interconnects 402 of the coil, which interconnects are now thickened by the metal layer 403, can be coated with a further passivation layer for protection against external effects.

The exemplary embodiments of the invention which are shown in FIG. 4 are to be understood as by way of example to the effect that numerous different configurations of the coil and generally of the microelectronic circuit with regard to the relative arrangements of the metal and auxiliary layers are possible by separation of the removal steps of the metal layer and of the auxiliary layer.

FIG. 5 shows a further exemplary embodiment of the invention, revealing a substrate 500, a passivation layer 501, interconnects 502 of a coil in sectional view, a metal layer 503 and a layer of photoresist 504. In FIG. 5a, firstly a layer of photoresist 504 is applied to the passivation layer 501 and is etched photolithographically above the locations of the passivation layer 501 which, for their part, are situated above the interconnects 502 of the coil.

Figure 5A:
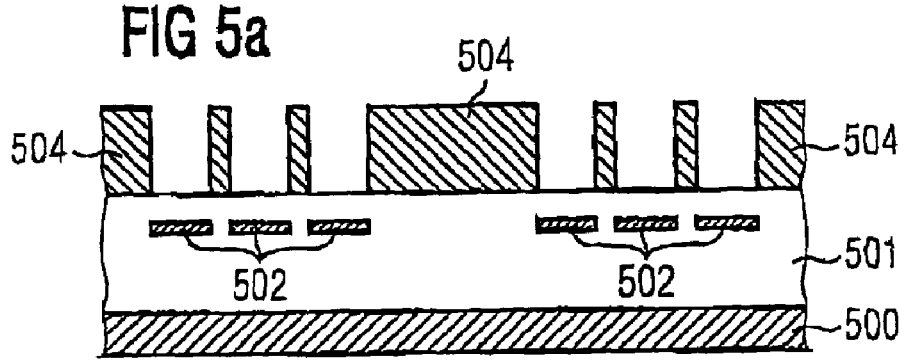
Figure 5B:
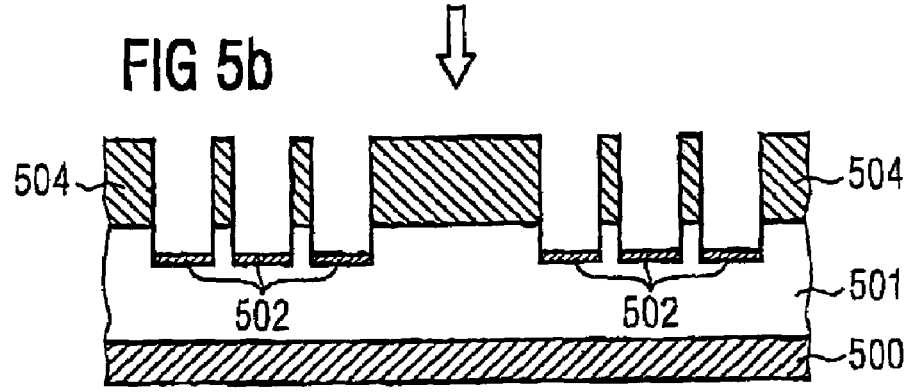

FIG. 5b shows the result after the etching of the regions of the passivation layer 501 which are situated above the interconnects 502.

Figure 5C:
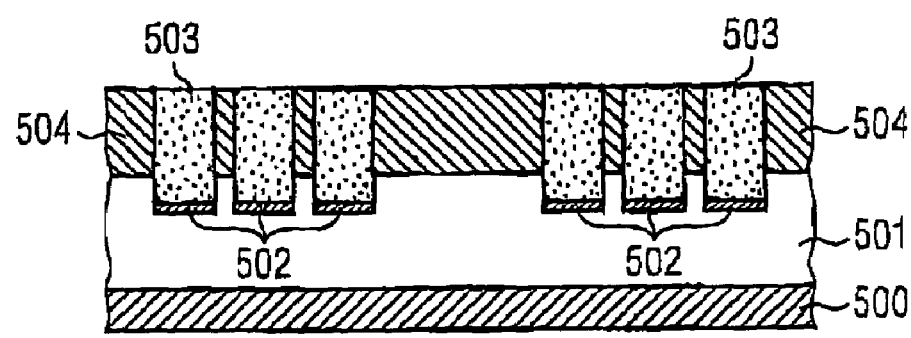

In FIG. 5c, the microelectronic circuit is then subjected to an electrodeposition method, with the result that the metal layer 503 grows as it were "automatically" on the interconnects. The effect thus achieved is that the layer of photoresist 504 functions as a mask which determines the local specificity of the metal growth.

Figure 1D:
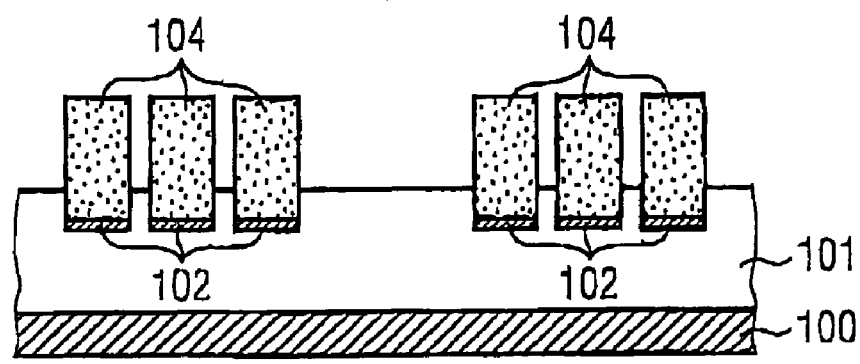
FIG. 1d shows the result of the removal of specific regions of the metal layer 104 from FIG. 1c in such a way that the metal of the metal layer 104 remains only above the respective interconnects 102 of the coil, in a manner such that it is in direct electrical contact with the said interconnects. Thus, the interconnects 102 of the coil are thickened by comparison with their initial state, which brings about an increase in the intrinsic conductivity of the interconnects 102. This increased conductivity consequently leads to an improved quality factor of the coil.
Figure 5D:
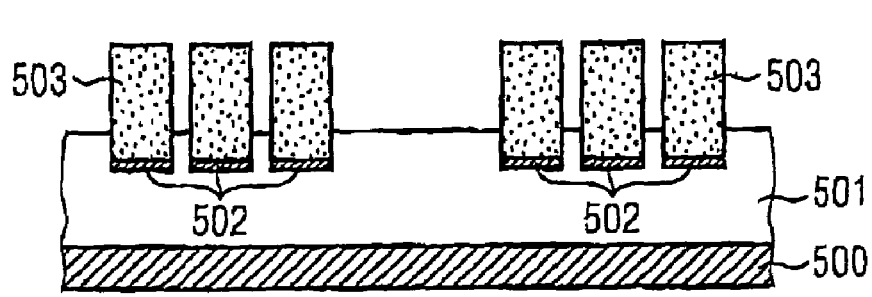

The layer of photoresist 503 can then subsequently be removed to give the result shown in FIG. 5d. This end result corresponds to that from FIG. 1d.

FIG. 6 shows a further exemplary embodiment of the invention, revealing a substrate 600, a passivation layer 601, interconnects 602 of a coil in sectional view, an electrically conductive auxiliary layer 603, a metal layer 604 and a layer of photoresist 605. FIG. 6a corresponds to the production state of FIG. 1b, in which those regions of the passivation layer 601 which are situated above the interconnects 602 of the coil have already been etched away.

Figure 6A:
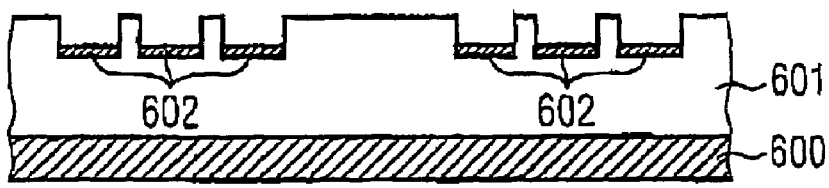
Figure 6B:
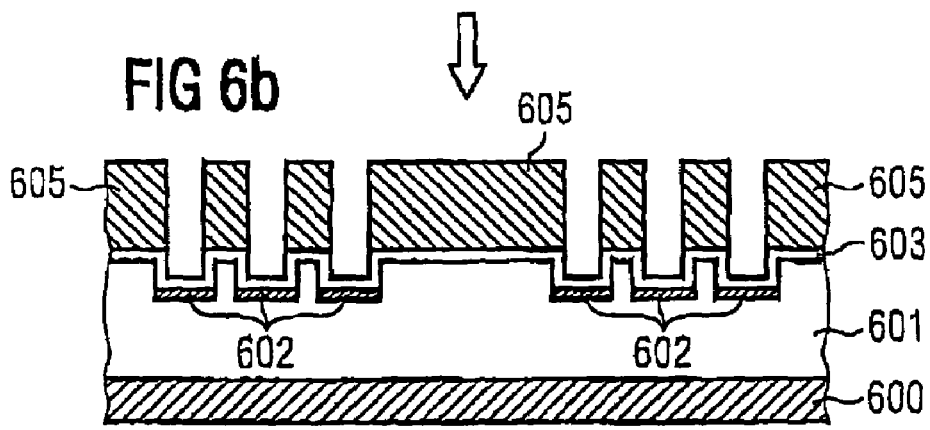

In FIG. 6b, firstly a layer of photoresist 605 is applied to the passivation layer 601 and is etched photolithographically above the locations of an electrically conductive auxiliary layer 601 which, for their part, are situated above the interconnects 602 of the coil.

Figure 6C:
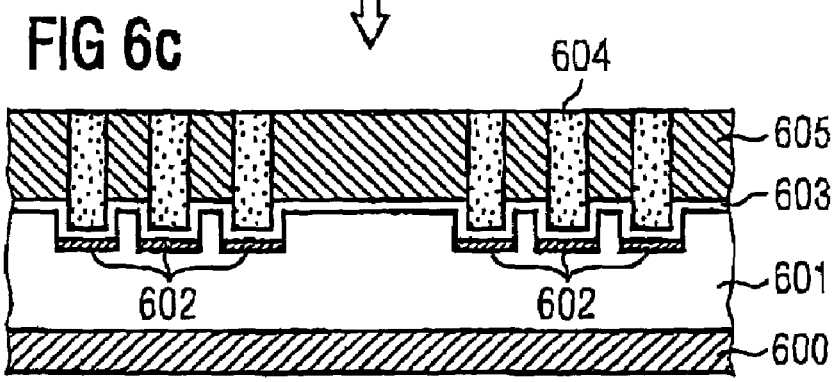

In FIG. 6c, the microelectronic circuit is then subjected to an electrodeposition method, with the result that the metal layer 604 grows as it were "automatically" on the interconnects. The effect thus achieved is that the layer of photoresist 605 functions as mask which determines the local specificity of the metal growth.

Figure 6D:
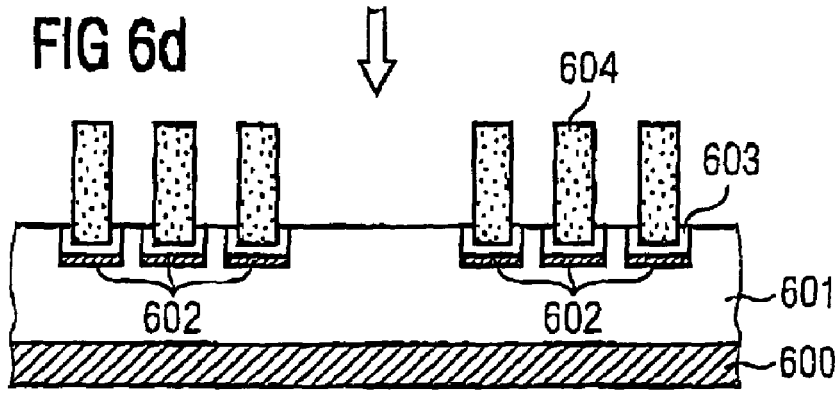

The layer of photoresist 605 can then subsequently be removed to give the result shown in FIG. 6d. This end result corresponds to that from FIG. 2d.

The following publications are cited in this document:
[1] EP 551735
[2] U.S. Pat. No. 4,613,843
[3] DE 197 21 310 A1
[4] DE 197 37 294 A1
[5] WO 95/05678

What is claimed is:

1. Method for fabricating a microelectronic circuit having at least one monolithically integrated coil, comprising:
   providing a finished processed microelectronic circuit having a monolithically integrated coil formed of metallic interconnects embedded within a passivation layer and covered by the passivation layer;
   removing all of the passivation layer directly above the interconnects of the monolithically integrated coil to expose the interconnects thereby; and
   applying a metal on the exposed interconnects of the monolithically integrated coil, so that the metal layer is electrically coupled to the interconnects of the monolithically integrated coil and thereby the interconnects of the integrated coil are thickened to increase the conductivity thereof.

2. Method according to claim 1, further comprising:
   applying an electrically conductive auxiliary layer at least above the monolithically integrated coil; and
   applying the metal layer on the auxiliary layer.

3. Method according to claim 2, further comprising removing regions of the auxiliary layer before the application of the metal layer in such a way that, after the removal, the auxiliary layer is situated
   above the monolithically integrated coil or
   above the monolithically integrated coil and above an unremoved region of the passivation layer.

4. Method according to claim 1, further comprising removing regions of the metal layer, so that the remaining metal layer lies directly above the monolithically integrated coil.

5. Method according to claim 2, further comprising removing regions of the metal layer, so that the remaining metal layer lies directly above the auxiliary layer.

6. Method according to claim 1, in which the removal
of the passivation layer and/or
of the metal layer
is carried out by means of a wet or dry etching method.

7. Method according to claim 2, further comprising removing the auxiliary layer by means of a wet or dry etching method.

8. Method according to claim 1, further comprising applying the metal layer by means selected from the group consisting of
an electrodeposition method,
an electroless deposition method,
a sputtering method,
a vapour deposition method, and
a plasma CVD method.

9. Method according to one of claims 2 to 7, in which the auxiliary layer is applied by means selected from the group consisting of an electrodeposition method, an electroless deposition method, a sputtering method, a vapour deposition method, and a plasma CVD method.

10. Method according to claim 1, further comprising forming the metal layer with a thickness of 0.5 $\mu$m to 10 $\mu$m.

11. Method according to claim 10, further comprises forming the metal layer is formed with a thickness of 3 $\mu$m to 6 $\mu$m.

12. Method according to claim 1, further comprising forming the metal layer from a metal which corresponds to the metal of the monolithically integrated coil, or which is different from the metal of the monolithically integrated coil.

13. Method according to claim 1, in which the metal layer is formed from the group consisting of
Cu,
Au,
Ag,
Pt, and
Al.

14. Method according to claim 2, in which the material used for the auxiliary layer is selected from the group consisting of
WSi,
Ti.
Pt,
NiCr
Mo,
Pd, and
Rh.

15. Method according to claim 2, further comprising forming the auxiliary layer with a thickness of 0.5 $\mu$m to 20 $\mu$m.

* * * * *